(12) United States Patent
Tsai et al.

(10) Patent No.: US 9,647,138 B2
(45) Date of Patent: May 9, 2017

(54) METAL OXIDE SEMICONDUCTOR TRANSISTOR

(75) Inventors: Chuang-Chuang Tsai, Hsinchu (TW); Hsiao-Wen Zan, Hsinchu (TW); Hsin-Fei Meng, Hsinchu (TW); Chun-Cheng Yeh, Hsinchu (TW)

(73) Assignee: E INK HOLDINGS INC., Hsinchu (TW)

( * ) Notice: Subject to any disclaimer, the term of this patent is extended or adjusted under 35 U.S.C. 154(b) by 0 days.

(21) Appl. No.: 13/480,742

(22) Filed: May 25, 2012

(65) Prior Publication Data

US 2012/0313084 A1 Dec. 13, 2012

(30) Foreign Application Priority Data

Jun. 10, 2011 (TW) .............................. 100120464 A

(51) Int. Cl.
*H01L 29/22* (2006.01)
*H01L 51/30* (2006.01)
*H01L 29/786* (2006.01)

(52) U.S. Cl.
CPC .. *H01L 29/78696* (2013.01); *H01L 29/78606* (2013.01); *H01L 29/78693* (2013.01)

(58) Field of Classification Search
CPC ............. H01L 29/7869; H01L 27/1225; H01L 21/02565; H01L 27/1251; H01L 29/78696; H01L 27/286; H01L 29/786; H01L 45/146

See application file for complete search history.

(56) References Cited

U.S. PATENT DOCUMENTS

| 2005/0258417 A1* | 11/2005 | Minakata | ............ H01L 51/0003 257/40 |
| 2006/0024937 A1* | 2/2006 | Yokoyama | .............. C23C 18/08 438/587 |
| 2009/0102751 A1 | 4/2009 | Takatoku | |

(Continued)

FOREIGN PATENT DOCUMENTS

| CN | 101414436 | 4/2009 |
| TW | 201017885 A | 5/2010 |
| TW | 201117382 A | 5/2011 |

OTHER PUBLICATIONS

Taiwan Patent Office, "Office Action", Jan. 15, 2014.
State Intellectual Property Office, "Office Action", Jul. 2, 2014.

*Primary Examiner* — Ori Nadav
*Assistant Examiner* — Ernest Allen, III
(74) *Attorney, Agent, or Firm* — WPAT, PC; Justin King; Douglas A. Hosack

(57) ABSTRACT

A metal oxide semiconductor transistor includes a gate, a metal oxide active layer, a gate insulating layer, a source, and a drain. The metal oxide active layer has a first surface and a second surface, and the first surface faces to the gate. The gate insulating layer is disposed between the gate and the metal oxide active layer. The source and the drain are respectively connected to the metal oxide active layer. The second surface defines a mobility enhancing region between the source and the drain. An oxygen content of the metal oxide active layer in the mobility enhancing region is less than an oxygen content of the metal oxide active layer in the region outside the mobility enhancing region. The metal oxide semiconductor transistor has high carrier mobility.

8 Claims, 3 Drawing Sheets

(56) References Cited

U.S. PATENT DOCUMENTS

| | | | |
|---|---|---|---|
| 2010/0035379 A1* | 2/2010 | Miyairi | H01L 27/1225 438/104 |
| 2010/0163885 A1* | 7/2010 | Park et al. | 257/72 |
| 2011/0024740 A1* | 2/2011 | Yamazaki | H01L 27/1225 257/43 |
| 2011/0062434 A1* | 3/2011 | Eguchi | H01L 27/1225 257/43 |
| 2011/0240988 A1* | 10/2011 | Yano | H01L 29/78609 257/43 |

* cited by examiner

METAL OXIDE SEMICONDUCTOR TRANSISTOR

TECHNICAL FIELD

The present invention relates to a semiconductor technology, and more particularly to a metal oxide semiconductor transistor.

BACKGROUND

An active layer is an important role in a transistor. A metal oxide semiconductor transistor includes a metal oxide semiconductor layer as the active layer. Comparative to an amorphous-silicon thin film transistor including an amorphous-silicon layer as the active layer, the metal oxide semiconductor transistor has higher carrier mobility. Comparative to a low temperature poly-silicon thin film transistor including a low temperature poly-silicon layer as the active layer, the metal oxide semiconductor transistor has a simpler manufacturing process. In addition, the metal oxide semiconductor layer has a better uniformity than the amorphous-silicon layer or the low temperature poly-silicon layer so that the metal oxide semiconductor transistors has a better performance than the amorphous-silicon thin film transistors or the low temperature poly-silicon thin film transistors.

Currently, in order to further improve the performance of the transistor, one method is to increase the carrier mobility of the transistor. Typically, the active layer of the transistor is commonly formed to a polycrystalline structure so as to improve the carrier mobility of the transistor. For example, a poly-silicon transistor utilizing a poly-silicon layer as the active layer has higher carrier mobility. However, the manufacturing process of the poly-silicon transistor is more difficult, and the poor uniformity of forming the poly-silicon layer will affect the performance of the transistor. In addition, in order to further improve the performance of the transistor, another method is to change a material composition of the active layer. However, it is difficult to develop a new material, which is not benefit for speeding up the performance improvement of the transistor.

SUMMARY

Therefore, the present invention provides a metal oxide semiconductor transistor with high carrier mobility.

An embodiment of the present invention provides a metal oxide semiconductor transistor including a gate, a metal oxide active layer, a gate insulating layer, a source, and a drain. The metal oxide active layer has a first surface and a second surface on two opposite sides of the metal oxide active layer, and the first surface faces to the gate. The gate insulating layer is disposed between the gate and the metal oxide active layer. The source and the drain are respectively connected to the metal oxide active layer. The second surface of the metal oxide active layer defines a mobility enhancing region between the source and the drain. An oxygen content of the metal oxide active layer in the mobility enhancing region is less than an oxygen content of the metal oxide active layer in a region outside the mobility enhancing region.

In one embodiment of the present invention, the metal oxide semiconductor transistor further includes the mobility enhancing layer disposed on the second surface of the metal oxide active layer in the mobility enhancing region. The material of the mobility enhancing layer includes a chemical composition capable of bonding with oxygen. Thus, the chemical composition capable of bonding with oxygen in the material of the mobility enhancing layer can react with the oxygen in the metal oxide compound of the metal oxide active layer. As a result, a portion of the oxygen in the metal oxide compound of the metal oxide active layer in the mobility enhancing region is lost. In another embodiment, the oxygen loss treatment is directly applied to the metal oxide compound of the metal oxide active layer in the mobility enhancing region by the mobility enhancing medium so that a portion of the oxygen in the metal oxide compound of the metal oxide active layer in the mobility enhancing region is lost. The oxygen content of the metal oxide active layer in the mobility enhancing region is decreased so that the carrier mobility of the metal oxide active layer is increased, thereby improving the performance of the metal oxide semiconductor transistor.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
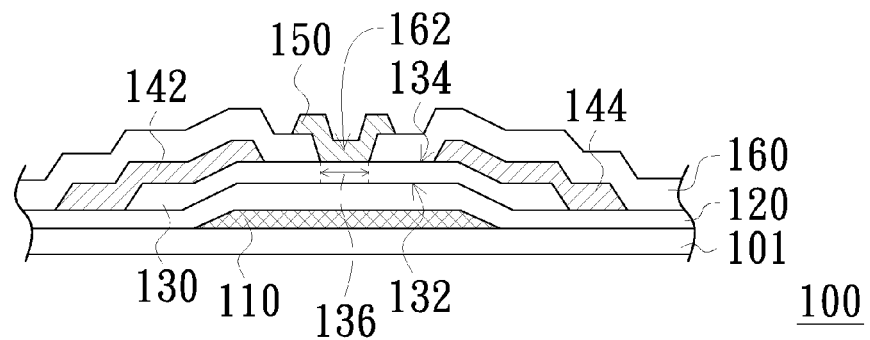
FIG. 1 is a cross-sectional, schematic view of a metal oxide semiconductor transistor in accordance with a first embodiment of the present invention.

FIG. 1 is a cross-sectional, schematic view of a metal oxide semiconductor transistor in accordance with a first embodiment of the present invention. Referring to FIG. 1, in the present embodiment, a metal oxide semiconductor transistor 100 is a bottom gate structure, and includes a substrate 101, a gate 110, a gate insulating layer 120, a metal oxide active layer 130, a source 142, a drain 144, and a mobility enhancing layer 150. The gate 110, the gate insulating layer 120, the metal oxide active layer 130, the source 142 and the drain 144, and the mobility enhancing layer 150 are disposed on the substrate 101 in sequence.

In the present embodiment, the gate 110 is disposed on a surface of the substrate 101, and the gate insulating layer 120 is disposed on the substrate 101 and covers the gate 110. The metal oxide active layer 130 is disposed on the gate insulating layer 120 and is located right above the gate 110. The metal oxide active layer 130 is made of, for example, indium-gallium-zinc-oxide (In—Ga—Zn—O). The metal oxide active layer 130 has a first surface 132 and a second surface 134 on two opposite sides of the metal oxide active layer 130. The first surface 132 of the metal oxide active layer 130 faces to the gate 110 and is contacted with the gate insulating layer 120. In other words, the gate insulating layer 120 is disposed between the gate 110 and the metal oxide active layer 130. The source 142 and the drain 144 are respectively connected to the second surface 134 of the metal oxide active layer 130. A portion of the second surface 134 of the metal oxide active layer 130 between the source 142 and the drain 144 is exposed so as to define a mobility enhancing region 136. The mobility enhancing layer 150 is disposed between the source 142 and the drain 144, located in the mobility enhancing region 136, and is contacted with the second surface 134 of the metal oxide active layer 130. It is noted that, the mobility enhancing layer 150 is not contacted with the source 142 and the drain 144. In the present embodiment, the metal oxide semiconductor transistor 100 further includes an insulated protecting layer 160. The insulated protecting layer 160 covers the source 142, the drain 144 and a portion of the metal oxide active layer 130, and is filled into a gap between the mobility enhancing layer 150 and the source 142 and a gap between the mobility enhancing layer 150 and the drain 144. Thus, the mobility enhancing layer 150, the source 142, and the drain 144 are spatially separated by the insulated protecting layer 160. The insulated protecting layer 160 further has an opening 162 exposing the mobility enhancing region 136. The mobility enhancing layer 150 is connected to the mobility enhancing region 136 through the opening 162. It is noted that, because the mobility enhancing layer 150 is not contacted with the source 142 and the drain 144, a leakage current of the metal oxide semiconductor transistor 100 can be reduced.

In addition, after the metal oxide active layer 130 is formed, a protecting layer (not shown) can be disposed on the second surface 134 of the metal oxide active layer 130. The protecting layer can prevent the metal oxide active layer 130 from being etched in the subsequent etch processes of forming the source 142, the drain 144 and the mobility enhancing layer 150. Thus, the protecting layer can serve as an etch stop layer to protect the metal oxide active layer 130. It is noted that, a portion of the second surface 134 of the metal oxide active layer 130 (i.e., at least the mobility enhancing region 136) should be exposed from the protecting layer. Thus, the mobility enhancing layer 150 can be disposed in the mobility enhancing region 136 of the metal oxide active layer 130 and be contacted with the second surface 134 of the metal oxide active layer 130.

The mobility enhancing layer 150 can increase the carrier density of the metal oxide active layer 130 or reduce the subgap density of states (DOS) in the tail state, thereby increasing the carrier mobility of the metal oxide active layer 130. In detail, a material of the mobility enhancing layer 150 includes a chemical composition capable of bonding with oxygen. When depositing the mobility enhancing layer 150 on the second surface 134 of the metal oxide active layer 130 in the mobility enhancing region 136, the chemical composition capable of bonding with oxygen will react with and bond with oxygen in the metal oxide compound of the metal oxide active layer 130. Thus, a portion of the oxygen in the metal oxide compound of the metal oxide active layer 130 in the mobility enhancing region 136 is lost so that an oxygen content of the metal oxide active layer 130 in the mobility enhancing region 136 is reduced and is less than an oxygen content of the metal oxide active layer 130 in the region outside the mobility enhancing region 136. As a result, the carrier mobility of the metal oxide active layer 130 is increased. For example, when the metal oxide active layer 130 includes an amorphous metal oxide semiconductor material, during forming the mobility enhancing layer 150, a reaction equation is M+AMOS→MOx+AMS. M represents the chemical composition capable of bonding with oxygen. AMOS represents the amorphous metal oxide semiconductor material. MOx represents a compound formed by bonding oxygen in the amorphous metal oxide semiconductor material with the chemical composition capable of bonding with oxygen. AMS represents an amorphous metal oxide semiconductor material whose a portion of the oxygen is lost.

In the present embodiment, the material of the mobility enhancing layer 150 can include an inorganic material capable of bonding with oxygen. The inorganic material can be metal, metal oxide or a composite of metal and metal oxide. The metal can be selected from a group consisting of calcium, lithium, potassium, sodium, magnesium, cesium, molybdenum and silver. The metal oxide can be selected from a group consisting of calcium oxide, lithium oxide, potassium oxide, magnesium oxide, cesium oxide, iron oxide, molybdenum oxide and other metal oxide compound capable of being oxidized to form a highest valence metal oxide compound (e.g., AlO can be oxidized to $Al_2O_3$). For example, the mobility enhancing layer 150 includes calcium that has a work function of 2.7 ev and can be oxidized to calcium oxide. Due to depositing calcium on the second surface 134 of the metal oxide active layer 130 in the mobility enhancing region 136, a portion of the oxygen of the metal oxide compound of the metal oxide active layer 130 in the mobility enhancing region 136 is lost. The reaction equation is $2Ca+O_2\rightarrow 2CaO$. Because the oxygen content of the metal oxide active layer 130 in the mobility enhancing region 136 is reduced, the carrier mobility of the metal oxide active layer 130 is increased. For example, in the present embodiment, due to the mobility enhancing layer 150 including calcium, the carrier mobility of the metal oxide active layer 130 is increased from 10 $cm^2V^{-1} s^{-1}$ to 80 $cm^2V^{-1} s^{-1}$. In addition, the material of the mobility enhancing layer 150 can be other solid materials. For example, the material of the mobility enhancing layer 150 can include an ionic compound capable of bonding with oxygen. The ionic compound is, for example, lithium aluminum hydride. The material of the mobility enhancing layer 150 can also include a covalent compound capable of bonding with oxygen. The covalent compound is, but not limited to, silicon, carbon, and silicon oxide. In summary, the mobility enhancing layer 150 should include the chemical composition capable of bonding with oxygen.

As mentioned above, when the material of the mobility enhancing layer 150 is the solid material capable of bonding with oxygen, the mobility enhancing layer 150 can be formed on the second surface 134 of the metal oxide active layer 130 in the mobility enhancing region 136. That is, the mobility enhancing layer 150 is a physical layer structure covering the second surface 134 of the metal oxide active layer 130 in the mobility enhancing region 136. According to the above principle, in other embodiments, an oxygen loss treatment can be directly applied to the second surface 134 of the metal oxide active layer 130 in the mobility enhancing region 136 by a mobility enhancing medium capable of bonding with oxygen. The mobility enhancing medium can be a liquid material capable of bonding with oxygen or a gaseous material capable of bonding with oxygen. Thus, a portion of the oxygen of the metal oxide compound of the metal oxide active layer 130 in the mobility enhancing region 136 is lost so that the oxygen content of the metal oxide active layer 130 in the mobility enhancing region 136 is reduced, thereby increasing the carrier mobility of the metal oxide active layer 130.

Figure 2:
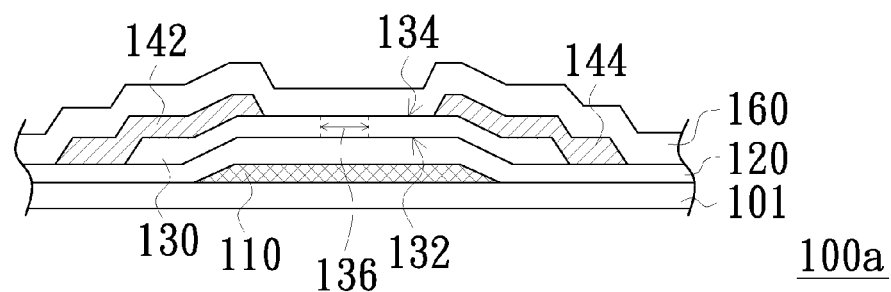
FIG. 2 is a cross-sectional, schematic view of a metal oxide semiconductor transistor in accordance with a second embodiment of the present invention.

FIG. 2 is a cross-sectional, schematic view of a metal oxide semiconductor transistor in accordance with a second embodiment of the present invention. Referring to FIG. 2, in the present embodiment, a metal oxide semiconductor transistor 100a is different from the metal oxide semiconductor transistor 100. Because the mobility enhancing medium is a liquid material or a gaseous material that is easy to be evaporated and dissipated, a physical layer structure will not be formed on the second surface 134 of the metal oxide active layer 130 in a mobility enhancing region 136. In other words, the metal oxide semiconductor transistor 100a does not include the physical layer structure similar to the mobility enhancing layer 150 of metal oxide semiconductor transistor 100. The mobility enhancing medium can include an organic material capable of bonding with oxygen. The organic material can be selected from a group consisting of 2-methylpentane, 2,2-dimethylbutane, tert-butyl alcohol, and benzene. The mobility enhancing medium can also include a covalent compound capable of bonding with oxygen. The covalent compound is, but not limited to, carbon monoxide and hydrogen. It is noted that, the insulated protecting layer 160 of the metal oxide semiconductor transistor 100a covers the source 142, the drain 144, and the entire metal oxide active layer 130.

Figure 3:
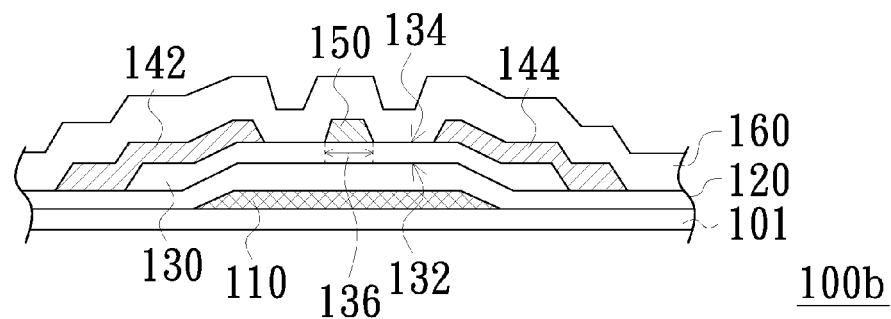
FIG. 3 is a cross-sectional, schematic view of a metal oxide semiconductor transistor in accordance with a third embodiment of the present invention.

FIG. 3 is a cross-sectional, schematic view of a metal oxide semiconductor transistor in accordance with a third embodiment of the present invention. Referring to FIG. 3, in the present embodiment, a metal oxide semiconductor transistor 100b is similar to the metal oxide semiconductor transistor 100 in the first embodiment except the insulated protecting layer 160. The insulated protecting layer 160 of the metal oxide semiconductor transistor 100b covers the source 142, the drain 144, the metal oxide active layer 130 and the mobility enhancing layer 150 and is filled in to a gap between the mobility enhancing layer 150 and the source 142, and a gap between the mobility enhancing layer 150 and the drain 144. Thus, the source 142, the drain 144 and the mobility enhancing layer 150 are separated by the insulated protecting layer 160. In other words, the mobility enhancing layer 150 is not exposed from the insulated protecting layer 160.

Figure 4:
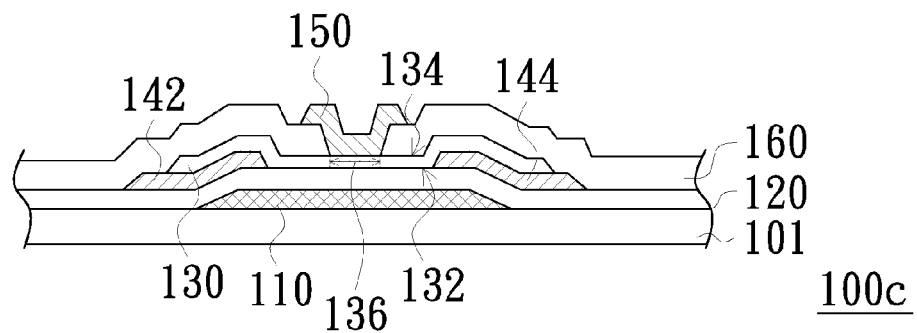
FIG. 4 is a cross-sectional, schematic view of a metal oxide semiconductor transistor in accordance with a fourth embodiment of the present invention.

FIG. 4 is a cross-sectional, schematic view of a metal oxide semiconductor transistor in accordance with a fourth embodiment of the present invention. Referring to FIG. 4, in the present embodiment, a metal oxide semiconductor transistor 100c is similar to the metal oxide semiconductor transistor 100 in the first embodiment except that the source 142 and the drain 144 are respectively connected to the first surface 132 of the metal oxide active layer 130.

Figure 5:
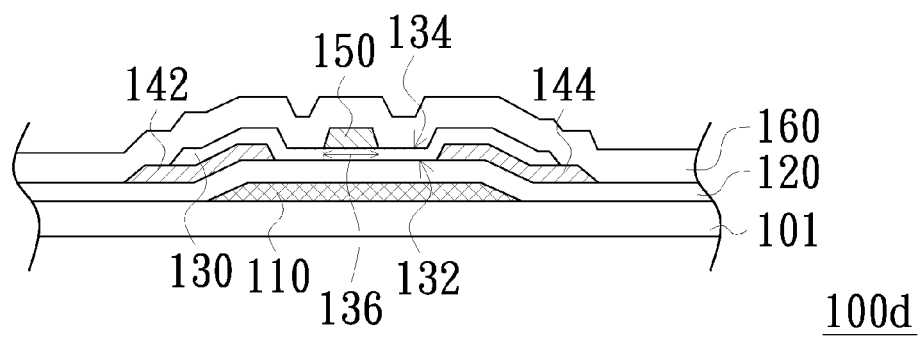
FIG. 5 is a cross-sectional, schematic view of a metal oxide semiconductor transistor in accordance with a fifth embodiment of the present invention.

FIG. 5 is a cross-sectional, schematic view of a metal oxide semiconductor transistor in accordance with a fifth embodiment of the present invention. Referring to FIG. 5, in the present embodiment, a metal oxide semiconductor transistor 100d is similar to the metal oxide semiconductor transistor 100c in the fourth embodiment except that the insulated protecting layer 160 of the metal oxide semiconductor transistor 100d covers the source 142, the drain 144, the metal oxide active layer 130 and the mobility enhancing layer 150. That is, the mobility enhancing layer 150 is not exposed from the insulated protecting layer 160.

Additionally, it is noted that, the metal oxide semiconductor transistor 100b in the third embodiment, the metal oxide semiconductor transistor 100c in the fourth embodiment, and the metal oxide semiconductor transistor 100d in the fifth embodiment can exclude the mobility enhancing layer 150. As described in the second embodiment, in other embodiments, the oxygen loss treatment can be directly applied to the second surface 134 of the metal oxide active layer 130 in the mobility enhancing region 136 by the mobility enhancing medium capable of bonding with oxygen. The mobility enhancing medium can be a liquid material capable of bonding with oxygen or a gaseous material capable of bonding with oxygen. Thus, a portion of the oxygen of the metal oxide compound of the metal oxide active layer 130 in the mobility enhancing region 136 is lost so that the oxygen content of the metal oxide active layer 130 in the mobility enhancing region 136 is reduced, thereby increasing the carrier mobility of the metal oxide active layer 130.

Figure 6:
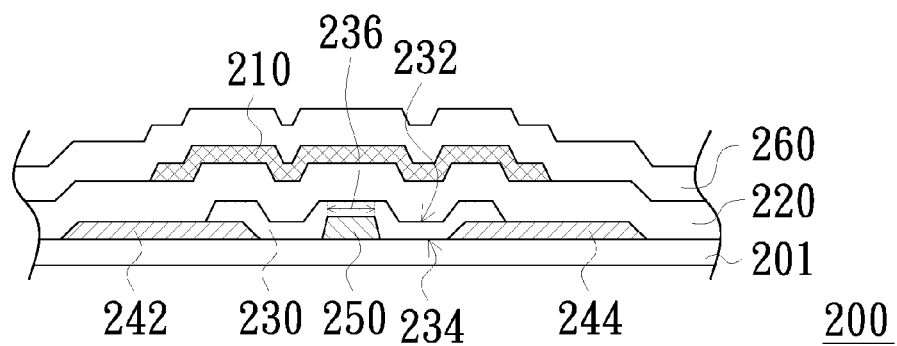
FIG. 6 is a cross-sectional, schematic view of a metal oxide semiconductor transistor in accordance with a sixth embodiment of the present invention.

FIG. 6 is a cross-sectional, schematic view of a metal oxide semiconductor transistor in accordance with a sixth embodiment of the present invention. Referring to FIG. 6, in the present embodiment, a metal oxide semiconductor transistor 200 is a top gate structure, and includes a substrate 201, a mobility enhancing layer 250, a metal oxide active layer 230, a source 242, a drain 244, a gate insulating layer 220, and a gate 210. The mobility enhancing layer 250, the source 242 and the drain 244, the metal oxide active layer 230, the gate insulating layer 220, and the gate 210 are disposed on the substrate 101 in sequence.

In the present embodiment, the mobility enhancing layer 250 is disposed on a surface of the substrate 201. The metal oxide active layer 130 is disposed on the substrate 201 and covers the mobility enhancing layer 250. The metal oxide active layer 230 has a first surface 232 and a second surface 234 on two opposite sides of the metal oxide active layer 230. The mobility enhancing layer 250 is contacted with the second surface 234 of the metal oxide active layer 230 so as to define a mobility enhancing region 236 on the second surface 234 of the metal oxide active layer 230. The source 242 and the drain 244 are disposed on the substrate 201 and are respectively connected to the second surface 234 of the metal oxide active layer 230. The mobility enhancing layer 250 is located between the source 242 and the drain 244. It is noted that, the mobility enhancing layer 250 is not contacted with the source 242 and the drain 244. In the present embodiment, the metal oxide active layer 230 having a suitable configuration is filled into a gap between the mobility enhancing layer 250 and the source 242, and a gap between the mobility enhancing layer 250 and the drain 244. Thus, the mobility enhancing layer 250, the source 242 and the drain 244 are spatially separated by the metal oxide active layer 230. The gate insulating layer 220 is disposed on the metal oxide active layer 230, the source 242 and the drain 244. The gate 210 is disposed on the gate insulating layer 220. In other words, the gate insulating layer 220 is located between the gate 210 and the metal oxide active layer 230. The first surface 232 of the metal oxide active layer 230 faces to the gate 210. In the present embodiment, the metal oxide semiconductor transistor 200 further includes an insulated protecting layer 260. The insulated protecting layer 260 is disposed on the gate 210 so as to cover the gate 210.

Figure 7:
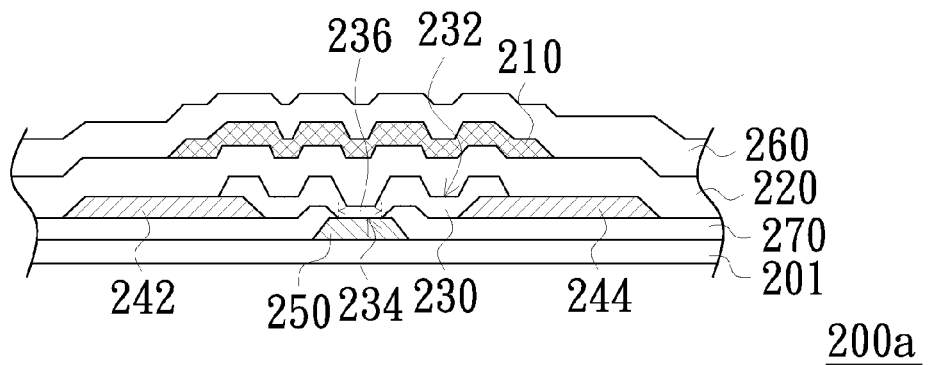
FIG. 7 is a cross-sectional, schematic view of a metal oxide semiconductor transistor in accordance with a seventh embodiment of the present invention.

FIG. 7 is a cross-sectional, schematic view of a metal oxide semiconductor transistor in accordance with a seventh embodiment of the present invention. Referring to FIG. 7, in the present embodiment, a metal oxide semiconductor transistor 200a is similar to the metal oxide semiconductor transistor 200 in the sixth embodiment except that the metal oxide semiconductor transistor 200a further includes an interval layer 270. The interval layer 270 is disposed on the substrate 201 and is located between the mobility enhancing layer 250 and the metal oxide active layer 230. The mobility enhancing layer 250 is contacted with the second surface 234 of the metal oxide active layer 230 exposed from an opening (not labeled) in the interval layer 270. In addition, the source 242 and the drain 244 both are disposed on the interval layer 270 and are respectively connected to the second surface 234 of the metal oxide active layer 230. In other words, the interval layer 270 is filled in to a gap between the mobility enhancing layer 250 and the source 242, and a gap between the mobility enhancing layer 250 and the drain 244. Thus, the mobility enhancing layer 250, the source 242 and the drain 244 are spatially separated by the interval layer 270 and the metal oxide active layer 230.

Figure 8:
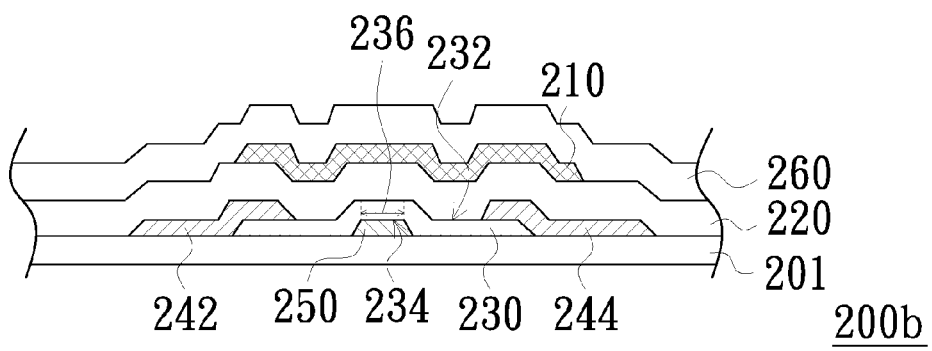
FIG. 8 is a cross-sectional, schematic view of a metal oxide semiconductor transistor in accordance with an eighth embodiment of the present invention.

FIG. 8 is a cross-sectional, schematic view of a metal oxide semiconductor transistor in accordance with an eighth embodiment of the present invention. Referring to FIG. 8, in the present embodiment, a metal oxide semiconductor transistor 200b is similar to the metal oxide semiconductor transistor 200 in the sixth embodiment except that a source 242 and a drain 244 are respectively connected to the first surface 232 of the metal oxide active layer 230.

Figure 9:
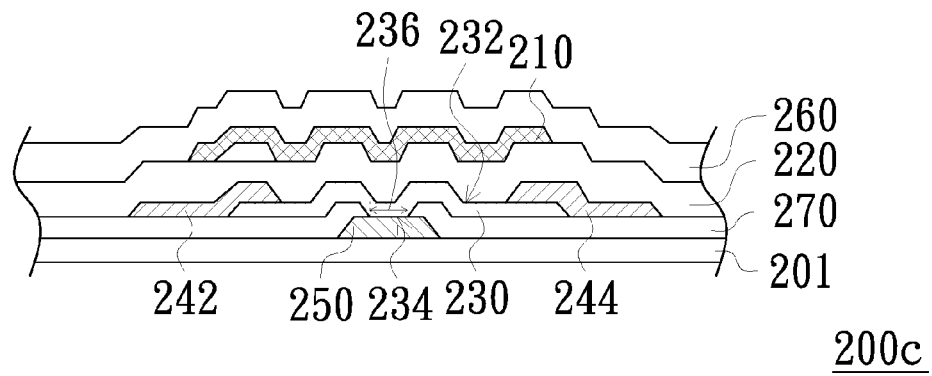
FIG. 9 is a cross-sectional, schematic view of a metal oxide semiconductor transistor in accordance with a ninth embodiment of the present invention.

FIG. 9 is a cross-sectional, schematic view of a metal oxide semiconductor transistor in accordance with a ninth embodiment of the present invention. Referring to FIG. 9, in the present embodiment, a metal oxide semiconductor transistor 200c is similar to the metal oxide semiconductor transistor 200a in the seventh embodiment except that a source 242 and a drain 244 are respectively connected to the first surface 232 of the metal oxide active layer 230.

A material of the mobility enhancing layer 250 the metal oxide semiconductor transistor 200/200a/200b/200c is identical to the mobility enhancing layer 150 in aforesaid embodiments. The material of the mobility enhancing layer 250 can be a solid material capable of bonding with oxygen. In a process of depositing the metal oxide active layer 230, a portion of the metal oxide active layer 230 in the mobility enhancing region 236 is contacted with the mobility enhancing layer 250. The oxygen in the metal oxide compound of the portion of the metal oxide active layer 230 in the mobility enhancing region 236 is lost. Thus, the oxygen content of the metal oxide active layer 230 in the mobility enhancing region 236 is reduced, thereby increasing the carrier mobility of the metal oxide active layer 230.

In summary, in one embodiment of the present invention, the metal oxide semiconductor transistor includes the metal oxide active layer. The metal oxide active layer has the first surface and the second surface on two opposite sides thereof, and the first surface faces to the gate. The metal oxide semiconductor transistor further includes the mobility enhancing layer disposed on the second surface of the metal oxide active layer in the mobility enhancing region. The material of the mobility enhancing layer includes a chemical composition capable of bonding with oxygen. Thus, the chemical composition capable of bonding with oxygen in the material of the mobility enhancing layer can react with the oxygen in the metal oxide compound of the metal oxide active layer. As a result, a portion of the oxygen in the metal oxide compound of the metal oxide active layer in the mobility enhancing region is lost. In another embodiment, the oxygen loss treatment is directly applied to the metal oxide compound of the metal oxide active layer in the mobility enhancing region by a mobility enhancing medium so that a portion of the oxygen in the metal oxide compound of the metal oxide active layer in the mobility enhancing region is lost. The oxygen content of the metal oxide active layer in the mobility enhancing region is decreased so that the carrier mobility of the metal oxide active layer is increased, thereby improving the performance of the metal oxide semiconductor transistor.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A metal oxide semiconductor transistor, comprising:
a gate;
a metal oxide active layer, having a first surface and a second surface on two opposite sides of the metal oxide active layer, the first surface facing to the gate;
a gate insulating layer, disposed between the gate and the metal oxide active layer;
a source, connected to the metal oxide active layer; and
a drain, connected to the metal oxide active layer;
wherein the metal oxide active layer comprises a mobility enhancing region between the source and the drain, and an oxygen content of the metal oxide active layer in the mobility enhancing region is less than an oxygen content of the metal oxide active layer in a region outside the mobility enhancing region;
wherein the metal oxide semiconductor transistor further comprises a mobility enhancing layer disposed on the second surface of the metal oxide active layer, and the mobility enhancing layer is located above the mobility enhancing region and wider than the mobility enhancing region,
wherein the metal oxide semiconductor transistor further comprises an insulated protecting layer covering the source, the drain, and the metal oxide active layer,
wherein the mobility enhancing layer is spatially separated from the source and the drain by the insulated protecting layer and is uncontacted with the source and the drain,
wherein a material of the mobility enhancing layer comprises an ionic compound capable of bonding with oxygen, and the ionic compound is lithium aluminum hydride.

2. The metal oxide semiconductor transistor according to claim 1, wherein the gate is located below the metal oxide active layer and the mobility enhancing layer is located above the metal oxide active layer.

3. The metal oxide semiconductor transistor according to claim 2, wherein the insulated protecting layer entirely covers the mobility enhancing layer.

4. The metal oxide semiconductor transistor according to claim 2, wherein the insulated protecting layer has an opening exposing a portion of the metal oxide active layer, and the opening is a through-hole, wherein the mobility enhancing layer is connected to the portion of the metal oxide active layer through the opening.

5. The metal oxide semiconductor transistor according to claim 1, wherein the gate is located above the metal oxide active layer and the mobility enhancing layer is located below the metal oxide active layer.

6. The metal oxide semiconductor transistor according to claim 5, further comprising a protecting layer covering the gate.

7. The metal oxide semiconductor transistor according to claim 5, further comprising a substrate, the mobility enhancing layer being disposed on the substrate, and an interval layer being disposed on the substrate and between the mobility enhancing layer and the metal oxide active layer, wherein the mobility enhancing layer is contacted with the second surface of the metal oxide active layer exposed from the interval layer.

8. The metal oxide semiconductor transistor according to claim 1, wherein the source and the drain are connected to the first surface of the metal oxide active layer or the source and the drain are connected to the second surface of the metal oxide active layer.

\* \* \* \* \*